United States Patent

Gottier

[11] Patent Number: 5,773,914
[45] Date of Patent: Jun. 30, 1998

[54] PIEZOELECTRIC RESONATOR

[75] Inventor: Hans-Rudolf Gottier, Safnern, Switzerland

[73] Assignee: Eta SA Fabriques d'Ebauches, Grenchen, Switzerland

[21] Appl. No.: 763,957

[22] Filed: Dec. 11, 1996

[30] Foreign Application Priority Data

Dec. 28, 1995 [FR] France .................................. 95 15636

[51] Int. Cl.⁶ .......................... H01L 41/04; H01L 41/053
[52] U.S. Cl. ........................................... 310/344; 310/370
[58] Field of Search .................................. 310/340, 344, 310/370

[56] References Cited

U.S. PATENT DOCUMENTS

| | | | |
|---|---|---|---|
| 3,697,789 | 10/1972 | Kato et al. | 310/344 |
| 3,931,388 | 1/1976 | Hafner et al. | 310/344 |
| 4,916,413 | 4/1990 | Nakayama et al. | 331/68 |
| 5,265,316 | 11/1993 | Ikeda et al. | 310/344 |
| 5,504,460 | 4/1996 | Ikeda et al. | 310/344 |
| 5,607,236 | 3/1997 | Takagi et al. | 310/344 |

FOREIGN PATENT DOCUMENTS

| | | | |
|---|---|---|---|
| 55-9815 | 7/1980 | Japan | 310/344 |
| 3-241912 | 10/1991 | Japan | 310/344 |

OTHER PUBLICATIONS

Patent Abstracts of Japan vol. 014, No. 429 (E–0978), 14 Sep. 1990 & JP–A–02 166910 (Matsushima Kogyo Co Ltd), 27 Jun. 1990.

Primary Examiner—Clayton E. LaBalle
Attorney, Agent, or Firm—Griffin, Butler, Whisenhunt & Szipl

[57] ABSTRACT

A piezoelectric resonator of small dimensions comprises a vibrating element mounted in a tight sealed housing (1) of elongated shape. The housing comprises a base (10) onto which a metal cap (9) is fixed, and coupling conductors (11) which pass through the base to connect the vibrating element to the exterior of the housing. The metal cap is formed by a part in the shape of a rectangular parallepiped which has, in its lengthwise direction, a cylindrical axial blind hole. This shape allows the cap to have a much better mechanical resistance than that of a conventional cylindrical cap and allows the resonator to be easily mounted, in an automatic manner, onto a support.

11 Claims, 1 Drawing Sheet

PIEZOELECTRIC RESONATOR

FIELD OF THE INVENTION

The present invention concerns piezoelectric resonators which comprise a vibrating element mounted in a tight sealed housing and more particularly quartz resonators of small dimensions which are most often used for making frequency generators in particular for portable electronic equipment, in numerous fields such as horology, computer science, telecommunications and medicine.

BACKGROUND OF THE INVENTION

Most quartz resonators of small dimensions which are currently found on the market can be classified in two categories: so-called "ceramic housing" resonators and so-called "metal housing" resonators.

The housings of the resonators which belong to the first category are relatively flat housings which generally comprise a main part of parallelepipedal shape in a ceramic material, within which is mounted the vibrating quartz element, a rectangular glass, ceramic or metal cover, which is soldered via a tight seal onto the main part and a connecting system, which may take different forms, for electrically connecting the excitation electrodes of the vibrating element to the exterior of the housing.

However they are designed and made in detail, these resonators are expensive.

The housings of the resonators which form part of the second category are housings of elongated shape which comprise a base with an essentially cylindrical contour onto which is driven a metal cap, which is also cylindrical, which may advantageously be manufactured by stamping. In such case, the electric connection between the electrodes of the vibrating element and the exterior of the housing is assured by two wires or two metal strips which pass through an insulating part of the base and whose internal ends are bonded or glued with the aid of a conductive adhesive material onto the contact pads of the vibrating element, so that these wires or strips also act as a support for this element.

Metal housing resonators which can be manufactured in a totally automated manner are much less expensive than ceramic housing resonators. Their cost can be two or three times cheaper. However they also have a certain number of disadvantages.

Firstly, due to the thinness of their caps, their housings can be quite easily damaged, for example when they are transported in bulk or handled automatically on machines.

Furthermore, it frequently happens that the fixing of a metal housing resonator onto a support such as a printed circuit board is limited to the necessary soldering of the ends of its connecting lugs, i.e. the external parts of its wires or metal strips, onto conductive parts of such support and to gluing its housing onto this same support, in particular to protect the resonator against vibrations or shocks. Since the housing is cylindrical, its contact or support surface on the support is very small which means that, even although glued thereupon, it has difficulty in stiffening the zone of the support in which it is situated. Thus, if the support is not itself rigid and if it may undergo deformations, the latter can cause the housing to come unstuck and/or the connecting lugs of the resonator or their connections with the conductive parts of the support to be broken.

Finally, metal housing resonators may also cause problems when they are automatically surface mounted, i.e. on printed circuit boards without holes.

As a matter of fact, in order to allow this type of mounting, resonators whose connecting lugs are already bent and ready to be bonded onto the printed circuit boards are delivered in tape-shaped plastic packaging, which may or may not be coiled, such packaging having separate recesses for receiving the resonators and not only allowing them to be transported but also to be automatically withdrawn from their recesses to place each of them on a printed circuit board, in the exact position in which they have to be mounted. Between the moment when they are placed in the tape and the moment when they are withdrawn therefrom, the resonators can rotate in their recesses and their connecting lugs can be deformed, which makes automatic mounting of such resonators more complicated than it should be.

There presently exists a solution which allows the disadvantages of metal housing resonators which have just been discussed to be overcome.

This solution which has already been known and used for several years consists of injection moulding a block of plastic material around the housing which completely envelops the latter, except on the base side, and which gives the whole the general shape of a rectangular parallelepiped. On the base side, the block of plastic material covers only approximately half of the surface of the base, this half being that which is situated under the connecting lugs. Furthermore, this part of the block acts as a form for bending the connecting lugs whose ends are folded back under such block.

Resonators of this type which are more especially designed for surface mounting also have disadvantages.

Firstly, their manufacture necessitates additional operations and materials and an injection moulding installation which increase their cost price and, secondly, their volume is markedly greater than that of a conventional metal housing resonator, which is inconvenient when they are to be used in instruments or apparatus of small dimensions.

SUMMARY OF THE INVENTION

An object of the present invention is to provide a metal housing piezoelectric resonator which has all the advantages of known resonators of this type but not their disadvantages.

In other words, an object of the invention is to provide a tight sealed metal housing piezoelectric resonator, of small volume and low cost, which can be manufactured in an entirely automatic manner and whose housing has good mechanical resistance.

Moreover, this resonator must be capable of reinforcing locally the support on which it is mounted when such support is not itself rigid and when it may undergo deformations.

Finally, another object of the invention is that such resonator be well suited to automatic surface mounting without this preventing or complicating it being mounted in another manner on a support.

These objects are achieved thanks to the fact that in the piezoelectric resonator, according to the invention, which comprises a vibrating element provided with electrodes and a tight sealed housing of elongated shape which contains the vibrating element and which comprises a metal cap, a base on which such cap is fixed and coupling conductors which pass through such base and which have internal ends electrically connected to the electrodes of the vibrating element, the metal cap of the housing is formed by a part in the shape of a rectangular parallelepiped which has in its lengthways direction a cylindrical axial blind hole.

BRIEF DESCRIPTION OF THE DRAWINGS

Other features and advantages of the invention will appear upon reading the description which follows and which refers to the attached drawing in which.

DESCRIPTION OF THE PREFERRED EMBODIMENT

Figure 1:
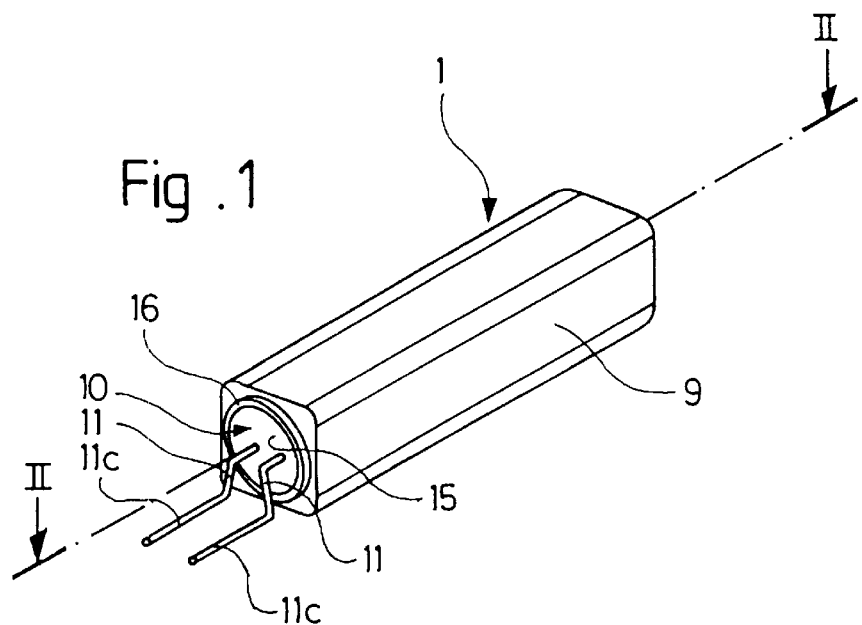
FIG. 1 is a perspective view of a preferred embodiment of the resonator according to the invention.

As it is shown in the drawing, the resonator according to the invention comprises a tight sealed housing 1 within which is enclosed in a vacuum or in an inert gas atmosphere a vibrating element 2 comprising a quartz tuning-fork 3 whose base 4 and arms 5 bear metallisations 6. Metallisations 6 form electrodes 7 on arms 5, which allows them to be subjected to electric fields and to cause them to vibrate according to a determined mode, and on base 4 connecting pads 8 for the vibrating element.

The shape and the arrangement of metallisations 6 on tuning-fork 3 will not be described here since they depend on features of the latter and on the manner in which arms 5 have to vibrate (flexion, torsion or other).

Housing 1 comprises the same parts as that of the metal housing resonators which were discussed previously, i.e. an elongated metal cap 9, a base 10 of essentially cylindrical shape, onto which is driven cap 9 and two conductors 11 which are electrically insulated from each other, which pass through base 10 and which serve both to connect electrically vibrating element 2 with the exterior of the housing and to support such element within said housing. For this purpose, conductors 11 have their internal ends 11a fixed via small mass of conductive adhesive material 12 onto connecting pads 8 of the vibrating element.

According to the invention, metal cap 9 is formed by a part in the shape of a rectangular parallelepiped, which has a cylindrical axial blind hole 14 in its lengthways direction.

As FIG. 1 shows, this part has a square section, which means that resonator 1 is practically no more bulky than a resonator having a cylindrical cap of the same length as that of cap 9 and an external diameter equal to the length of the sides of the cross section of the latter.

On the other hand, as a result of its parallelepipedal shape, cap 9 of the resonator according to the invention is much more massive and consequently much more rigid and much more mechanically resistant than a cylindrical cap.

Moreover, cap 9 can be easily manufactured and at a low cost from a bar of square section of a metal material such as copper-nickel-zinc alloy or brass, which is both easy to machine and capable of being elastically deformed at the moment the cap is driven onto base 10, by making in said bar, at one of its ends, by profile-turning, a cylindrical longitudinal hole, of determined depth and diameter, and then separating the part which forms the cap from the rest of the bar by cutting. Naturally, it would also be possible to do the contrary, i.e. to begin by cutting the bar to obtain a full parallelepipedal part of the desired length and then to make in this latter a cylindrical, longitudinal blind hole, also by profile-turning.

Furthermore, it already appears clearly that as a result of the parallelepipedal shape of their caps, resonators like resonator 1 do not have the disadvantages of conventional cylindrical housing resonators, as regards their transportation in tapes and their automatic mounting on supports, in particular printed circuit boards, and if it happens that their support surface is still insufficient, it is easy to resolve this problem by providing such resonators with housings of not square but rectangular section, in other words wider housings than that which is shown in FIG. 1 but no higher and no longer than the latter if one wishes to increase as little as possible the volume of such housings.

Finally, there is another reason for which it is advantageous to have a parallelepipedal housing rather than a cylindrical housing. This reason is as follows:

When a resonator housing is made, one always assures that the mass and the rigidity of such housing are adapted to the features of the vibrating element so that the completed resonator has, amongst other things, very good electric performances and so that it keeps them as long as possible.

For a cylindrical housing of a given length and whose base remains the same, this adaptation can only be made by modifying the thickness of the cap.

On the contrary, for a parallelepipedal housing, it is possible to change the length of each side of the section of the cap if such section is square or the width and/or the thickness of such cap if its section is rectangular, which allows both freer and more precise adaptation than that which can be effected for a housing with a cylindrical cap.

This being said, in the case of a conventional metal housing resonator, the internal stresses to which the cap is subjected in its part which surrounds the base are uniformly distributed around the latter, given that the cap has the same thickness throughout.

On the contrary, in the case of a parallelepipedal cap, the stresses are no longer the same in the corners as in the thinner parts.

For this reason, it might be thought that to make a parallelepipedal housing whose tight sealing is as good and as durable as that of a cylindrical housing, it is necessary to design a new base or at least to provide for the diameters of such base and of the hole of the cap even more severe tolerances than those which must be respected for the manufacture of a cylindrical housing resonator.

Experience has shown that this is not the case and that one can very well use the same base and have the same tolerances in both cases, which is another advantage of the resonator according to the invention.

Figure 2:
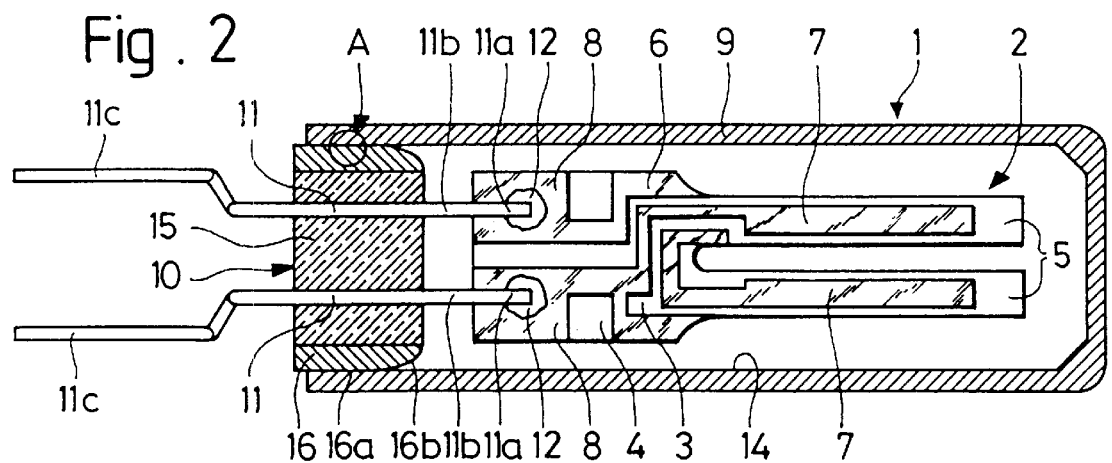
FIG. 2 is a longitudinal cross-section of the same resonator, according to plane II—II of FIG. 1.

As it is shown in FIG. 2, this base comprises a central cylindrical part 15 made of an insulating material, more precisely of glass, through which conductors 11 pass and which is surrounded by a ring 16 formed of a metal material capable of adhering very well to glass, having practically the same thermal expansion coefficient as the latter and being well suited to galvanic treatment, which is the case for example for the nickel, cobalt and iron alloy known by the brand name of "KOVAR" and the iron and nickel alloy called "alloy 42".

As can be seen in the same figure, the external surface of ring 16 has, on the side opposite to that where vibrating element 2 is situated, a main cylindrical part 16a which represents approximately seven tenths of its width and a part having an approximately spherical shape 16b which facilitates the introduction of base 10 into cap 9 and the centering of the latter at the moment when it is driven onto the base.

It is to be noted that in order to facilitate still further the introduction of base 10 into cap 9 it is possible to chamfer the internal edge of this cap.

Figure 3:
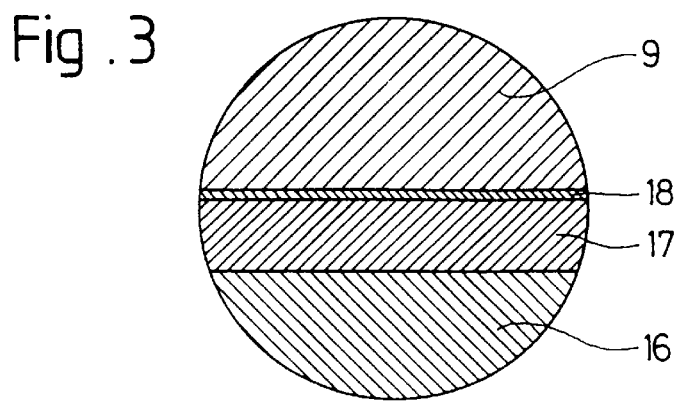
FIG. 3 is an enlarged view of zone A of FIG. 2.

Furthermore, as FIG. 3 shows, the external surface of ring 16 is covered with two metal layers 17 and 18.

First layer 17 which is a relatively thick galvanic layer, for example of approximately 10 μm, is an elastically deformable layer which is compressed when the cap is driven onto the base and which, as a result of such deformation allows the tight sealing of housing 1 to be assured. This layer 17 is preferably itself formed of several layers, for example a layer of copper, a layer of lead and tin alloy and a layer of silver.

Second layer 18 which is approximately ten to fifty times thinner than layer 17 is a gold layer which is also galvanic and deformable, and which has the role of protecting the metal surface of the base against oxidisation and other phenomena which could cause it to deteriorate and to assure that this surface remains clean between the moment when the base is manufactured and that when it is assembled with the cap.

As regards conductors 11, they are formed of wires of small diameter, manufactured initially from a material having the same properties as those which have been indicated previously with regard to the material which forms ring 16 and which may thus also be "KOVAR" or alloy 42.

Since these wires have undergone the same galvanic treatments as base 16, their internal parts 11b which support vibrating element 2 and their external parts 11c which form connecting lugs for the resonator are covered by the same layers 17 and 18 as the base. These layers are not without use since it has been verified that for certain adhesives gold layer 18, in particular, allowed the reliability of the adhesion of the ends of wires 11 onto the connecting pads 8 of vibrating element 2 to be increased and that this same layer also allowed, in certain cases, the soldering of the connecting lugs of the resonator onto a support to be made more reliable.

As they are shown in the drawing, these connecting lugs are more especially provided for surface mounting of the resonator. This is the reason why they have been folded twice, at approximately 90°, so that their ends are substantially parallel to the longitudinal axis of the resonator and tangential to the plane in which is situated the face of cap 9 which will be in contact with the support on which the resonator will be mounted.

This having been said, it is quite clear that the invention is not limited to the embodiment which has just been described.

In particular, the connecting lugs could have a different shape and could be, for example, simply straight.

The internal ends of the conductors could be bonded and not glued onto the connecting pads of the vibrating element and these conductors could be not wires but thin, narrow metal strips.

Furthermore, the base could be made differently, for example, in the form of a substantially cylindrical and essentially metal block, with only two small sleeves of insulating material at the places where the connecting conductors pass.

Moreover, the cap could be nickel or chromium plated and not driven but soldered onto the base.

Finally, it is quite evident that the vibrating element could have a shape other than that of a tuning-fork, for example that of a bar, and that whatever its shape, this element could be supported in the housing by means other than the coupling conductors themselves, for example suspension bars attached to the base. In certain cases, the vibrating element could even be directly glued, via one of its ends, to such base.

What is claimed is:

1. A piezoelectric resonator comprising a vibrating element provided with electrodes and a tight sealed housing of elongated shape, containing said vibrating element and comprising a metal cap, a base on which said cap is fixed and coupling conductors passing through said base and having internal ends electrically connected to said electrodes of the vibrating element, said metal cap being formed by a part in the shape of a rectangular parallelepiped which has in its lengthways direction a cylindrical axial blind hole.

2. A resonator according to claim 1, wherein said part in the shape of a rectagular parallelepiped has a substantially square section.

3. A resonator according to claim 1, wherein said cap is made of copper-nickel-zinc alloy.

4. A resonator according to claim 1, wherein said cap is driven onto said base.

5. A resonator according to claim 4, wherein said base comprises a central cylindrical part of an electrically insulating material, through which said conductors pass, a metal ring surrounding said central cylindrical part and at least one metal layer covering the external surface of said ring and capable of being elastically deformed, which is compressed when said cap is driven onto said base to assure the tight sealing of said housing.

6. A resonator according to claim 5, wherein said metal layer is itself covered in a thin layer of gold.

7. A resonator according to claim 5, wherein said central cylindrical part is made of glass.

8. A resonator according to claim 1, wherein the internal ends of the coupling conductors are fixed onto the vibrating element and support the latter within said housing.

9. A resonator according to claim 8, wherein the internal ends of the connecting conductors are fixed onto the vibrating element by means of a conductive adhesive material.

10. A resonator according to claim 1, wherein said vibrating element comprises a quartz tuning-fork whose arms bear said electrodes.

11. A piezoelectric resonator comprising a vibrating element provided with electrodes and a tight sealed housing for enclosing the vibrating element, the housing comprising a base having coupling conductors extending therethrough with the internal ends of the conductors electrically connected to said electrodes, the housing further comprising a metal cap fixed on said base, the metal cap comprising a body in the shape of a solid parallelepiped having a cylindrical blind hole for receiving the vibrating element.

* * * * *